United States Patent [19]
Royer

[11] Patent Number: 4,841,351
[45] Date of Patent: Jun. 20, 1989

[54] HGCDTE PHOTODIODE WITH HIGH SPEED RESPONSE

[75] Inventor: Michel Royer, Paris, France

[73] Assignee: S.A.T. (Société Anonyme de Télécommunications), France

[21] Appl. No.: 181,023

[22] Filed: Apr. 13, 1988

[30] Foreign Application Priority Data

Apr. 14, 1987 [FR] France ................... 87 05256

[51] Int. Cl.$^4$ ............................ H01L 27/14
[52] U.S. Cl. ...................... 357/30; 357/61; 357/16; 357/65; 357/67; 357/71; 357/63
[58] Field of Search ............... 357/30 B, 30 P, 30 Q, 357/30 L, 30 E, 61, 16, 65, 71, 63, 67

[56] References Cited

U.S. PATENT DOCUMENTS

| | | | |
|---|---|---|---|
| Re. 31,968 | 8/1985 | Mickelsen et al. | ............ 136/260 |
| 3,725,310 | 4/1973 | Donohue | ........... 357/30 B X |
| 3,801,966 | 4/1974 | Terao | ............ 357/30 B X |
| 3,978,510 | 8/1976 | Kasper et al. | ............. 357/30 B |
| 4,319,069 | 3/1982 | Tyan | .................. 357/71 X |
| 4,357,620 | 11/1982 | Wang et al. | ................ 357/16 |
| 4,439,912 | 4/1984 | Pollard | .................. 29/572 |

FOREIGN PATENT DOCUMENTS 2103878 2/1983 United Kingdom .

OTHER PUBLICATIONS

Franciosi et al., "Yherbium Monolayer Diffusion Barriers at $HG_{1-x}CD_xTe$", *Appl. Phys. Lett.*, 52(18), May 2, 1988, pp. 1490–1492.

*Primary Examiner*—Rolf Hille
*Assistant Examiner*—William A. Mintel
*Attorney, Agent, or Firm*—Lowe, Price, Leblanc, Becker & Shur

[57] ABSTRACT

The invention relates to a photodiode with high speed response formed in a P type HgCdTe semiconductor substrate. On one face of this invention an N type doped zone is formed. A metallization is in contact with a layer of copper telluride $Cu_2Te$, disposed on the other face of the HgCdTe semiconductor substrate, opposite the PN junction. Such a photodiode, sensitive to the near infrared, has a low series resistance which confers thereon a high speed response.

9 Claims, 1 Drawing Sheet

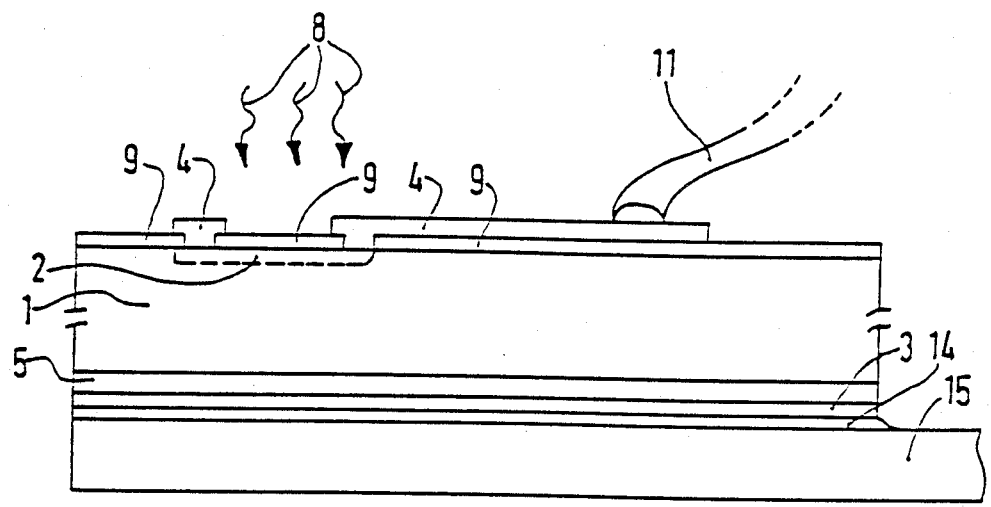

HGCDTE PHOTODIODE WITH HIGH SPEED RESPONSE

BACKGROUND OF THE INVENTION

1. Field of the Invention

The present invention relates to a photodiode made from a P type HgCdTe semiconductor substrate in which an N doped zone is formed on one face thus providing a PN junction and having metallizations giving access to the P and N zones.

Such photodiodes are sensitive to the near infrared and the wavelength on which their maximum sensitivity is centered depends on the composition of the semiconductor crystal of the substrate. This composition is defined by the molar fraction x of the formula $Hg_{1-x}Cd_xTe$, which molar fraction may vary form 0 to 1. These photodiodes are used particularly in optical fiber telecommunications, at wavelengths of 1.30 and 1.55 microns for example.

2. Description of the Prior Art

Photodiodes of the above defined type are already known which however have the drawback of a relatively slow response, i.e. they transmit badly the high components of the frequency spectrum of the signals which modulate the light radiation which they detect. At the present time, the cut-off frequencies of these photodiodes are of the order of 500 to 800 MHz. It is obvious that this limits the flow of information which may be transmitted through optical fiber telecommunications systems. It is therefore essential to have photodiodes with higher cut-off frequencies. Now, it is known that the cut-off frequency of a photodiode is all the higher the lower the product RC of the series resistance R and of the capacity C of its equivalent diagram. Thus, one means for increasing the frequency consists in reducing the value of the series of resistance R of the equivalent diagram.

Now, this resistance R is the total series resistance of the photodiode, and the two main components of this resistance are the resistance of the P type HgCdTe semiconductor substrate and the resistance of the contact between the substrate and the metallization for access thereto.

To reduce the resistance of the substrate, the thickness thereof may be reduced by mechanical polishing, for example to 50 microns, which represents substantially the lower limit of what it is possible to do. Then, for example in the case of a P type HgCdTe disk with a resistivity of 10 ohm.cm and a diameter of 150 micron, a resistance of the substrate is obtained of the order of 200 ohms.

However, in order to obtain the total series resistance R of the photodiode, the value of the contact resistance with the metallization should be added thereto. Now, it is difficult to reduce the contact resistance with known techniques which consist in inserting, between the P type semiconductor crystal and the metal of the metallization, an overdoped P+ layer. In fact, as is known, the alloy HgCdTe is difficult to overdope, and there always exists a rectifying effect between the P type substrate and the P+ layer, which increases the resistance of the contact.

The present invention overcomes this drawback by providing a photodiode whose contact resistance between the substrate and the metallization is low, so as to obtain a low total series resistance, and so a high speed response.

SUMMARY OF THE INVENTION

For this the present invention provides a photodiode of the above defined type wherein the metallization giving access to the P zone is in contact with a degenerated $Cu_2Te$ layer disposed on the PN face of said HgCdTe semiconductor substrate opposite the P junction.

In the photodiode of the invention, since the copper telluride $Cu_2Te$ is a degenerated semiconductor of low resistivity, it forms between the P type substrate and the metallization a low resistance contact.

Advantageously, said degenerated layer has a thickness substantially equal to 0.1 micron.

Advantageously still, said degenerated layer is obtained by immersing said substrate in an aqueous solution of CuCl.

In this case, the $Cu_2Te$ layer is obtained simply by ionic exchange.

BRIEF DESCRIPTION OF THE DRAWINGS

The present invention will be better understood from the following description of the preferred embodiment of the photodiode of the invention and a method for producing same, with reference to the accompanying drawings in which the single FIGURE shows a schematical sectional view of a photodiode of the invention.

DESCRIPTION OF THE PREFERRED EMBODIMENT

The single FIGURE shows a photodiode, for detecting infrared radiation shown schematically in the form of incident photons 8, and transforming this detected radiation into an electric signal appearing between two metallizations 3 and 4.

In a way known per se, the photodiode includes a PN junction, resulting form the formation of an N type zone 2 on the upper face, in the figure, of a P type HgCdTe semiconductor substrate 1. Metallization 4, also disposed on the upper face of substrate 1, gives access through a passivation zone 9 to the N type zone 2. A connecting wire 11 is soldered to the metallization 4.

On the lower face, in the figure, of substrate 1, metallization 3 is in contact with the whole surface of a layer 5 of copper telluride $Cu_2Te$, opposite the PN junction. Metallization 3 is bonded, by means of a conducting adhesive layer 14, to a metallized alumina support 15.

Thus, we may say that metallization 3 gives access to the P zone, namely to the P type HgCdTe substrate 1 through the copper telluride layer $Cu_2Te$.

In the figure, the metallizations 3 and 4 are connected, through support 15 and wire 11, respectively, to pins of the case, not shown for the sake of simplicity, in which the photodiode is mounted.

The photodiode which has just been described is produced as will now be explained.

Starting with a solid P type HgCdTe crystal, obtained for example by the THM method (Travelling Heater Method) described in French Pat. No. 2 502 190 or the modified THM method described in the French patent application No. 86 00769. The solid crystal is then reduced in thickness by mechanical polishing, so as to form substrate 1 of a thickness in this case of the order of 100 microns.

The edges and the upper face, in the figure, of substrate 1 are then masked with a photo-etching resin and substrate 1 is immersed in an aqueous CuCl solution. The aqueous CuCl solution has here a concentration of 4 g/l, it is heated to 80° C. and the substrate 1 is immersed therein for 15 mins., which provides a layer 5 of copper telluride $Cu_2Te$ of a thickness of about 0.1 micron.

During this immersion, the copper telluride $Cu_2Te$ is obtained by ionic exchange, a cadmium atom being replaced by two Cu atoms so as to give the degenerated semiconductor $Cu_2Te$.

The reaction is improved by the addition of the chloride, bromide or iodide of an alkaline or alkaline-earth metal, for example sodium chloride, potassium iodide or ammonium salt for solubilizing the copper telluride, hydrazine dichloride, a reducing agent for stabilizing the degree of oxidation of the copper, and sodium tartrate for adjusting the pH to a value of the order of 4 to 5. Careful rinsing is carried out at the end of the reaction. The N type zone 2 may then be formed in a known way, for example using the planar technique of mercury diffusion through passivation layers, as taught in French Pat. No. 2 336 804 or else by ionic implantation of indium or aluminum, as taught by French Pat. No. 2 488 048. A guard ring, also of known type, may be formed.

With a molar fraction, or composition, x close to 0.7, the photodiode formed using an $Hg_{0.3}Cd_{0.7}Te$ crystal will have a maximum sensitivity centered on a wavelength of 1.3 micron. By choosing a different value, this sensitivity maximum may be shifted, in a known way, and in particular its value may be brought to 12 microns for x close to 0.2.

It is also possible, and following the teaching of French Pat. No. 2 501 915, to choose the composition x so that the forbidden band Eg and spin-orbit band energies are closely related, which provides a current gain by multiplication effect.

The main characteristics of the photodiodes thus formed, operating at ambient temperature, with a circular sensitive surface of a diameter of 80 microns, adapted to the diameter of the optical fibers for telecommunications are the following for x equals 0.7:

Reverse bias voltage: $-10$ V
Reverse current (V=$-10$ V):<10 nA
Current response at $\lambda=1.3$ um:>0.7 A/W
Total capacity (V=$-10$ V): 0.7 pF
Series resistance: 200 $\Omega$
Reverse resistance: 1000 M$\Omega$
Rise time: 300 ps
Cut-off frequency ($-3$ dB): 1000 MHz As can be seen, the low value of the series resistance leads to a higher cut-off frequency than for the prior art diodes.

What is claimed is:

1. A phototdiode made from a P type HgCdTe semiconductor substrate in which an N type doped zone is formed on one face thus providing a PN junction, and with metallizations for access to the P and N zones, wherein the metallization giving access to the P zone is in contact with a degenerated $Cu_2Te$ layer disposed on the P face of said HgCdTe semiconductor substrate opposite the PN junction.

2. The photodiode as claimed in claim 1, wherein said degenerated layer has a thickness of substantially 0.1 micron.

3. The photodiode as claimed in claim 1, in which said degenerated layer is obtained by immersing said substrate in an aqueous CuCl solution.

4. The photodiode as claimed in claim 3, wherein, with said aqueous CuCl solution having a concentration of substantially 4 g/l and being heated to substantially 80° C., said substrate is immersed for substantially 15 minutes in said aqueous solution.

5. The photodiode as claimed in claim 3, wherein said aqueous CuCl solution further contains sodium tartrate so that its pH remains between substantially 4 and substantially 6. The photodiode as claimed in claim 3, wherein said aqueous CuCl solution further contains a substance chosen from the following: chloride, bromide or iodide of an alkaline or alkaline-earth metal.

7. The photodiode as claimed in claim 3, wherein said aqueous CuCl solution further contains a reducing agent.

8. The photodiode as claimed in claim 7, wherein said reducing agent is hydrazine dichlorate.

9. The photodiode as claimed in claim 1, wherein, with the composition of said HgCdTe semiconductor substrate defined by the formula $HG_{1-x}Cd_xTe$, the molar fraction x is between substantially 0.2 and substantially 0.7.

* * * * *